US012635489B2

(12) United States Patent
Sun

(10) Patent No.: US 12,635,489 B2
(45) **Date of Patent: \*May 19, 2026**

(54) HIGH VOLTAGE SEMICONDUCTOR DEVICE AND METHOD OF MANUFACTURING SAME

(71) Applicant: DB HiTek Co., Ltd., Bucheon-si (KR)

(72) Inventor: Jong Won Sun, Icheon-si (KR)

(73) Assignee: DB HiTek Co., Ltd., Bucheon-si (KR)

(\*) Notice: Subject to any disclaimer, the term of this patent is extended or adjusted under 35 U.S.C. 154(b) by 408 days.

This patent is subject to a terminal disclaimer.

(21) Appl. No.: 18/353,697

(22) Filed: Jul. 17, 2023

(65) Prior Publication Data

US 2024/0395599 A1     Nov. 28, 2024

(30) Foreign Application Priority Data

May 26, 2023     (KR) ......................... 10-2023-0068165

(51) Int. Cl.
  H10W 10/17        (2026.01)
  H10D 84/00        (2025.01)
          (Continued)

(52) U.S. Cl.
  CPC ............ H10W 10/17 (2026.01); H10D 84/00 (2025.01); H10W 10/0145 (2026.01); H10W 10/021 (2026.01); H10W 10/20 (2026.01)

(58) Field of Classification Search
  CPC ............. H10W 10/17; H10W 10/0145; H10W 10/021; H10W 10/20; H10D 84/00;
          (Continued)

(56) References Cited

U.S. PATENT DOCUMENTS 5,939,765 A * 8/1999 Zheng ............... H01L 21/76232
                                                257/E21.549
11,756,992 B1 * 9/2023 Pang ...................... H10D 30/65
                                                257/499

(Continued)

FOREIGN PATENT DOCUMENTS

KR     10-2014-0119954 A     10/2014

OTHER PUBLICATIONS

H. Kitahara et al., "A Deep Trench Isolation integrated in a 0.13um BiCD process technology for analog power ICs", IEEE BCTM 13.2, Institute of Electrical and Electronics Engineers, 2008, Japan.

(Continued)

*Primary Examiner* — Julia Slutsker
(74) *Attorney, Agent, or Firm* — Bridgeway IP Law Group, PLLC; Jihun Kim

(57)         ABSTRACT

Proposed is a high voltage semiconductor device and a method of manufacturing the same and, more particularly, a high voltage semiconductor device and a method of manufacturing the same, which allow the upper end of an air gap or void formed in a DTI region to be positioned relatively deep in a substrate by forming a wide region with a relatively wide lateral width on the upper part of the DTI region, thereby preventing external exposure of the air gap in a subsequent process and preventing foreign substances such as tungsten from remaining on the upper side of the DTI region accordingly.

12 Claims, 12 Drawing Sheets

(51) Int. Cl.
    *H10W 10/00*     (2026.01)
    *H10W 10/20*     (2026.01)
(58) Field of Classification Search
    CPC .. H10D 30/65; H10D 30/0281; H10D 62/115;
              H10P 50/244; H01L 21/76232; H01L
                        21/764; H01L 21/30655
    See application file for complete search history.

(56)                 References Cited

U.S. PATENT DOCUMENTS

2014/0291767 A1*  10/2014  Lee ................... H01L 21/76229
                                                438/422
2021/0050414 A1*   2/2021  Chu ..................... H10D 62/115

OTHER PUBLICATIONS

Tower Semiconductor, 2021 Online Technology Global Symposium.

\* cited by examiner

HIGH VOLTAGE SEMICONDUCTOR DEVICE AND METHOD OF MANUFACTURING SAME

CROSS REFERENCE TO RELATED APPLICATION

The present application claims priority to Korean Patent Application No. 10-2023-0068165, filed May 26, 2023, the entire contents of which is incorporated herein for all purposes by this reference.

BACKGROUND OF THE INVENTION

Field of the Invention

The present disclosure relates to a high voltage semiconductor device and a method of manufacturing the same. More specifically, the present disclosure relates to a high voltage semiconductor device and a method of manufacturing the same, which allow the upper end of an air gap or void formed in a DTI region to be positioned relatively deep in a substrate by forming a wide region with a relatively wide lateral width on the upper part of the DTI region, thereby preventing external exposure of the air gap in a subsequent process and preventing foreign substances such as tungsten from remaining on the upper side of the DTI region accordingly.

Description of the Related Art

In recent Bipolar-CMOS-DMOS (BCD) processes, achieving a high breakdown voltage of 100V or more has become essential. To fulfill this high voltage requirement, a deep trench isolation (DTI) region is employed in the process. The purpose of the DTI region is to prevent any increase in leakage current by ensuring effective electrical isolation between adjacent devices. FIGS. 1 and 2 are cross-sectional views showing the structure of a conventional high voltage semiconductor device, and FIG. 3 is an SEM picture showing a formation position of an upper end of an air gap in the high voltage semiconductor device shown in FIG. 2.

Hereinafter, the structure and problems of a conventional high voltage semiconductor device will be described in detail with reference to FIGS. 1 to 3.

Referring to FIG. 1, a DTI region 710 used for electrical isolation between adjacent devices is formed by forming a trench region by etching the surface of a substrate 701 to a predetermined depth in one etching process. Then, the DTI region is formed by gap-filling an insulating material in the trench region. When the DTI region is formed by forming the trench in a single process as described above, there are technical limitations in forming a deep trench. That is, when the DTI region is formed by etching the substrate 701 in a single process, it is not easy to form the DTI region sufficiently deep so that adjacent devices are electrically isolated. In addition, even if a trench is formed, problems may occur during a gap filling process.

Due to such limitations, when the DTI region 710 is formed to achieve a high breakdown voltage (BV) of 100V or more, the DTI region 710 is not formed deep enough, and thus the breakdown voltage characteristics are deteriorated because of an area increase in the electric field to the region below the DTI region and an increase in the leakage current. Accordingly, as the separation distance between devices is increased in order to prevent noise generation between adjacent devices, the overall chip size inevitably increases.

To solve the above-mentioned problems, referring to FIG. 2, in a high voltage semiconductor device 9 according to another embodiment, in order to form an isolation region 91 at a sufficiently deep position within a substrate 901, the isolation region 91 is formed to include a Pre-DTI region 91a and a DTI region 91b. That is, the isolation region 91 is formed in two stages.

When the DTI region 91b is formed after the Pre-DTI region 91a is formed as described above, since separate mask patterns PRa and PRb need to be used for each step, manufacturing cost may increase. Moreover, since a step is formed on the sidewall boundary between the Pre-DTI region 91a and the DTI region 91b, manufacturing defects may be caused.

When the isolation region 91 is formed in two stages, the Pre-DTI region 91a and the DTI region 91b, as described above, a separate mask pattern needs to be used for each trench formation step, manufacturing cost may increase.

In addition, when the upper end of an air gap AG formed in the isolation region 91 extends to the Pre-DTI region 91a on the substrate 901 (see FIGS. 2 and 3), that is, when the upper end of the air gap AG is formed at a relatively high position, the possibility of cracks occurring along the Pre-DTI region 91a of the upper part of the air gap AG cannot be ruled out in a subsequent process.

To solve the above problems, the inventor of the present disclosure proposes a novel high voltage semiconductor device with an improved structure/process and a method of manufacturing the same, which will be described in detail later.

Document of Related Art (Patent Document 1) Korean Patent Application No. 10-2013-0034805 "SEMICONDUCTOR DEVICE AND MANUFACTURING METHOD THEREOF"

SUMMARY OF THE INVENTION

The present disclosure is directed to providing a high voltage semiconductor device and a method of manufacturing the same, which allow the upper end of an air gap/void inevitably formed in a DTI region to be positioned relatively deep in a substrate by making a lateral width of the upper side of the DTI region relatively wide, thereby preventing cracking and consequent retention of foreign substances in a subsequent process.

In addition, the present disclosure is directed to providing a high voltage semiconductor device and a method of manufacturing the same, which allow an inclined surface with a lateral width gradually narrowing as it extends downward is formed on one side of a wide region of the DTI region, so that the step difference between the wide region and a narrow region is minimized.

In addition, the present disclosure is directed to providing a high voltage semiconductor device and a method of manufacturing the same, which prevent an increase in manufacturing cost by not using an additional mask pattern when forming the wide region after forming the narrow region.

In addition, the present disclosure is directed to providing a high voltage semiconductor device and a method of manufacturing the same, which prevent the lateral width of the upper part of a trench from being narrowed by performing a Bosch process after performing a non-Bosch process when forming the trench.

In addition, the present disclosure is directed to providing a high voltage semiconductor device and a method of manufacturing the same, which reduce manufacturing cost by not utilizing a separate mask pattern in an upper region forming process for wide region formation.

In addition, the present disclosure is directed to providing a high voltage semiconductor device and a method of manufacturing the same, which prevent an active area from narrowing and enable more reliable electrical isolation between devices since an STI region is formed to surround the DTI region.

The disclosure may be implemented by embodiments having the following configuration in order to achieve the above-described objectives.

According to an embodiment of the present disclosure, there is provided a high voltage semiconductor device, including: a substrate; a gate electrode disposed on the substrate; a source region on a surface of the substrate and a drain region spaced apart from the source region; and a DTI region extending to a predetermined depth from the surface of the substrate and including an insulating material, wherein the DTI region may include: a wide region positioned at an upper side of the DTI region; a narrow region extending from a bottom of the wide region to a predetermined depth of the substrate and having a lateral width less than that of the wide region; and an air gap formed in the DTI region.

According to another embodiment of the present disclosure, in the high voltage semiconductor device of the present disclosure, the wide region may include, on a side wall thereof, an inclined surface whose lateral width gradually narrows as the inclined surface extends downward.

According to still another embodiment of the present disclosure, in the high voltage semiconductor device of the present disclosure, the inclined surface may have a cross-sectional shape of a curved sidewall.

According to still another embodiment of the present disclosure, in the high voltage semiconductor device of the present disclosure, the wide region may be formed by etching an upper region of a trench after forming the trench for the narrow region.

According to still another embodiment of the present disclosure, in the high voltage semiconductor device of the present disclosure, a lateral width of the bottom of the wide region may be substantially equal to a lateral width of an uppermost part of the narrow region.

According to still another embodiment of the present disclosure, in the high voltage semiconductor device of the present disclosure, the narrow region may have a scallop structure on at least one side wall thereof.

According to still another embodiment of the present disclosure, the high voltage semiconductor device of the present disclosure may further include: an STI region configured to have a structure surrounding one side of the DTI region in the substrate.

According to still another embodiment of the present disclosure, in the high voltage semiconductor device of the present disclosure, an upper end of the air gap may be located lower than a bottom of the STI region.

According to still another embodiment of the present disclosure, a high voltage semiconductor device of the present disclosure include: a substrate; a gate electrode disposed on the substrate; a source region and a drain region on a surface of the substrate; and a DTI region extending to a predetermined depth from the surface of the substrate and including an insulating material, wherein an upper side of the DTI region may have a portion in which a lateral width thereof continuously narrows in a vertical direction.

According to still another embodiment of the present disclosure, in the high voltage semiconductor device of the present disclosure, the upper side of the DTI region may extend such that both sidewalls thereof facing each other at a predetermined height may narrow downward.

According to still another embodiment of the present disclosure, in the high voltage semiconductor device of the present disclosure, the DTI region may include: a wide region positioned at the upper side of the DTI region; and a narrow region extending from a bottom of the wide region to a predetermined depth of the substrate, wherein a maximum lateral width of the wide region may be greater than a maximum lateral width of the narrow region.

According to still another embodiment of the present disclosure, in the high voltage semiconductor device of the present disclosure, the wide region may have a substantially same lateral width as that of the narrow region at a boundary with the narrow region.

According to still another embodiment of the present disclosure, the high voltage semiconductor device of the present disclosure may further include: a body region surrounding the source region in the substrate; a deep well region surrounding a first well region in the substrate; the first well region surrounding the drain region in the deep well region; a buried layer located beneath the deep well region in the substrate; and a high-voltage well region connected to both the buried layer and the deep well region in the substrate.

According to an embodiment of the present disclosure, a method of manufacturing a high voltage semiconductor device includes: forming a trench by etching a substrate to a predetermined depth; forming an upper region by widening a width of an uppermost part of the trench in a lateral direction; depositing and gapfilling a first insulating layer on the substrate and in the trench and the upper region; performing an etch-back on the first insulating layer on the substrate; and forming a DTI region by depositing a second insulating layer on the substrate and on the first insulating layer in the trench and the upper region.

According to another embodiment of the present disclosure, in the method of manufacturing a high voltage semiconductor device, the upper region may be formed by a high-pressure treatment process.

According to still another embodiment of the present disclosure, in the method of manufacturing a high voltage semiconductor device, the forming the trench may include: forming a first trench extending to a predetermined depth from a surface of the substrate; and forming a second trench from a bottom of the first trench to a predetermined depth in the substrate, wherein the first trench may be formed by an etching process different from that of the second trench.

According to still another embodiment of the present disclosure, in the method of manufacturing a high voltage semiconductor device, the first trench may be formed by a non-Bosch process, and the second trench may be formed by a Bosch process.

According to still another embodiment of the present disclosure, the method of manufacturing a high voltage semiconductor device may further include: removing the second insulating layer from the substrate.

According to still another embodiment of the present disclosure, in the method of manufacturing a high voltage semiconductor device, the DTI region may include an air gap formed therein, wherein an upper end of the air gap may be positioned at a depth of 4000 A or more from a surface of the substrate.

According to still another embodiment of the present disclosure, the method of manufacturing a high voltage semiconductor device may further include: forming an ONO layer on the substrate prior to forming the trench.

The present disclosure has the following effects by the above configuration.

According to the present disclosure, it is possible to prevent cracking and consequent retention of foreign substances in a subsequent process since the upper end of an air gap/void inevitably formed in a DTI region is positioned relatively deep in a substrate by making a lateral width of the upper side of the DTI region relatively wide.

In addition, according to the present disclosure, it is possible to minimize the step difference between a wide region and a narrow region since an inclined surface with a lateral width gradually narrowing as it extends downward is formed on one side of the wide region of the DTI region.

In addition, according to the present disclosure, it is possible to prevent an increase in manufacturing cost by not using an additional mask pattern when forming the wide region after forming the narrow region.

In addition, according to the present disclosure, it is possible to prevent the lateral width of the upper part of a trench from being narrowed by performing a Bosch process after performing a non-Bosch process when forming the trench.

In addition, according to the present disclosure, it is possible to reduce manufacturing cost by not utilizing a separate mask pattern in an upper region forming process for wide region formation.

In addition, according to the present disclosure, it is possible to prevent an active area from narrowing and enable more reliable electrical isolation between devices since an STI region is formed to surround the DTI region.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, these embodiments are only provided for reference in order to more completely explain the present disclosure to those of ordinary skill in the art.

Hereinafter, it should be noted that when one component (or layer) is described as being disposed on another component (or layer), one component may be disposed directly on another component, or another component(s) or layer(s) may be located between the components. In addition, when one component is expressed as being directly disposed on or above another component, no other component(s) are located between the components. Moreover, being located on "top", "upper", "lower", "top", "bottom" or "one (first) side" or "side" of a component means a relative positional relationship.

In addition, it should be noted that, where certain embodiments are otherwise feasible, certain process sequences may be performed other than those described below. For example, two processes described in succession may be performed substantially simultaneously or in the reverse order.

Moreover, the conductivity type or doped region of the components may be defined as "p-type" or "n-type" according to the main carrier characteristics, but this is only for convenience of description, and the technical spirit of the present disclosure is not limited to what is illustrated. For example, hereinafter, "p-type" or "n-type" will be used as more general terms "first conductivity type" or "second conductivity type", and here, the first conductivity type means p-type, and the second conductivity type means n-type.

Furthermore, it should be understood that "high concentration" and "low concentration" expressing the doping concentration of the impurity region mean the relative doping concentration of one component and another component.

Figure 4:
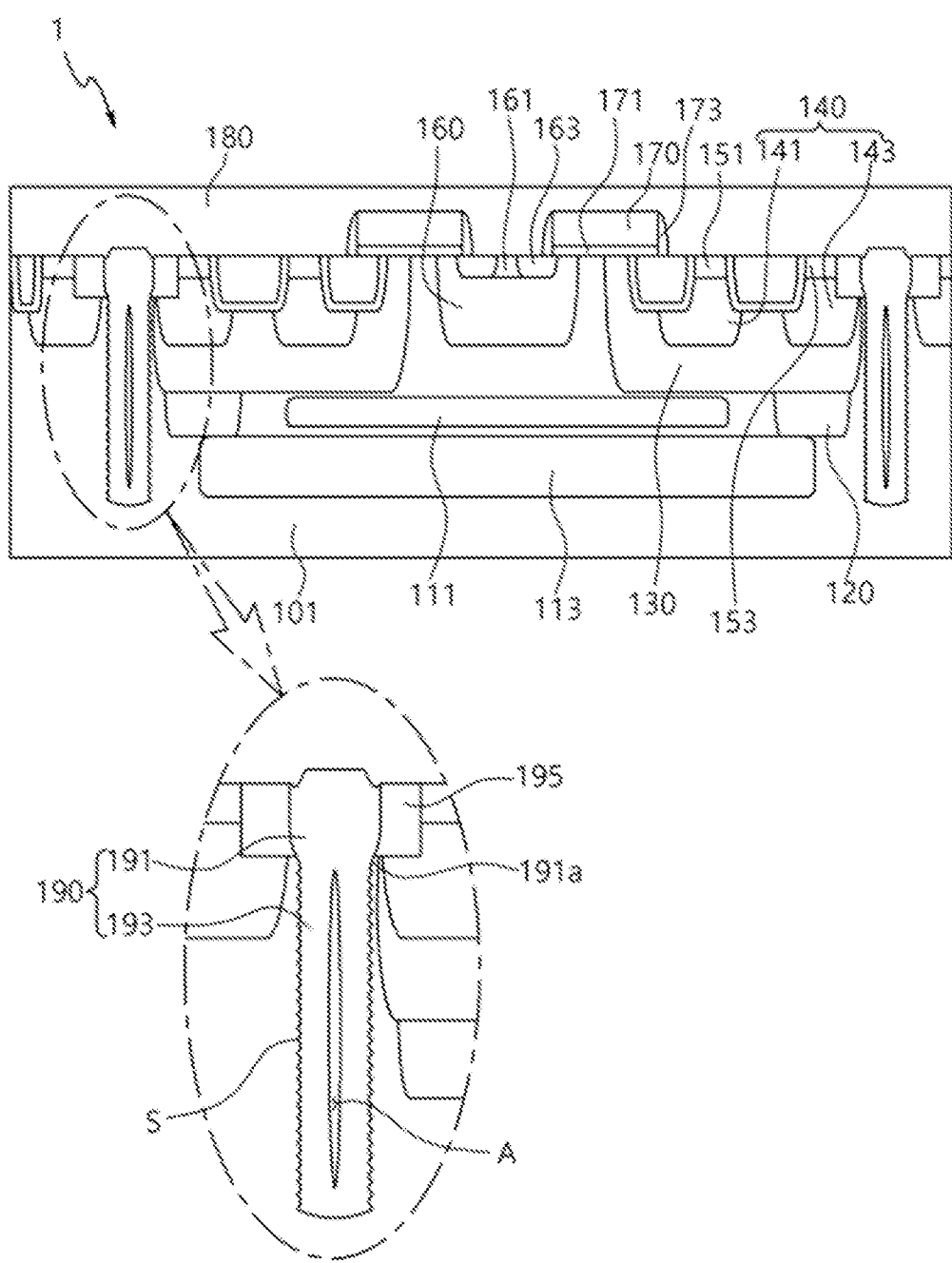
FIG. 4 is a cross-sectional view showing a high voltage semiconductor device according to an embodiment of the present disclosure.
Figure 5:
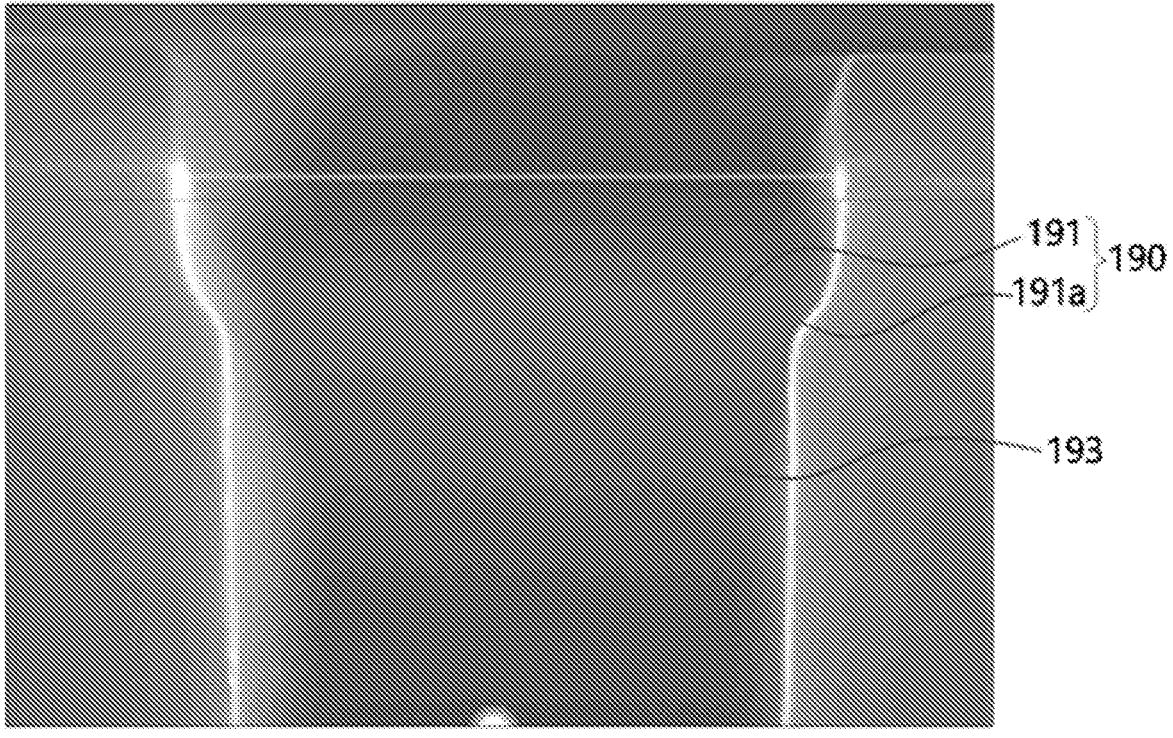
FIG. 5 is an SEM picture showing a DTI region shown in FIG. 4.

FIG. 4 is a cross-sectional view showing a high voltage semiconductor device according to an embodiment of the present disclosure, and FIG. 5 is an SEM picture showing a DTI region shown in FIG. 4.

Hereinafter, a high voltage semiconductor device 1 according to an embodiment of the present disclosure will be described in detail with reference to the accompanying drawings.

Referring to FIG. 4, the present disclosure relates to the high voltage semiconductor device 1 and, more specifically, to the high voltage semiconductor device 1 in which the upper end of an air gap or void formed in a DTI region 190 is positioned relatively deep in a substrate 101 by forming a wide region 191 with a relatively wide lateral width on the upper part of the DTI region 190, thereby preventing external exposure of the air gap in a subsequent process and preventing foreign substances such as tungsten from remaining on the upper side of the DTI region 190 accordingly.

As will be described in detail below, it is desirable that the sidewall of the wide region 191 on the boundary side with a narrow region 193 is formed with an inclined surface 191a having a lateral width gradually narrowing as it extends downward so as to be naturally connected to the upper end of the wide region 191. At this time, the cross-section of the sidewall of the inclined surface 191a may have a substantially straight or curved shape, or may include both straight and curved shapes, and the scope of the present disclosure is not limited by specific examples.

In addition, the formation depth of the DTI region 190 is preferably formed to a depth of about 10 μm or more and about 40 μm or less from the surface of the substrate 101, and more preferably about 35 μm deep, but it should be noted that the scope of the present disclosure is not limited by specific numerical values/numerical ranges.

The high voltage semiconductor device 1 may include the substrate 101. A well region used as an active region may be formed in the substrate 101, and the well region may be defined by an STI region 195 as an isolation layer. In addition, the substrate 101 may be a substrate doped with a first conductivity type, a diffusion region of the first conductivity type disposed in the substrate, or may include an epitaxial layer of the first conductivity type epitaxially grown on the substrate. The STI region 195 may be formed by using a shallow trench isolation (STI) process, but is not limited thereto.

The high voltage semiconductor device 1 may include a first buried layer 111 and a second buried layer 113 in the substrate 101. For example, the first buried layer 111 may be formed over the second buried layer 113. In addition, a high-voltage well region 120 may be formed to be connected to one side of the second buried layer 113. The high-voltage well region 120 is an ion implantation region (HVNWELL) of a second conductivity type, and may be formed in the substrate 101 and on the second buried layer 113.

The first buried layer 111 may be an impurity doped region of a first conductivity type, and the second buried layer 113 may be an impurity doped region of a second conductivity type. It should be noted that the first buried layer 111 and the high-voltage well region 120 are not essential components of the present disclosure and thus can be omitted in some cases.

A deep well region 130 may be formed in the substrate 101 and on the high-voltage well region 120. Preferably, the deep well region 130 has one side connected to the high-voltage well region 120 and may be a second conductivity type impurity doped region (DNWELL). The deep well region 130 may be formed to be directly connected to the second buried layer 113 in some cases, and in this case, the bottom of the deep well region 130 may be connected to the second buried layer 113.

In the deep well region 130, for example, a pair of well regions 140 (141, 143) of the second conductivity type may be formed, and a drain region 151 may be formed in a first well region 141 and a heavily doped region 153 may be formed in a second well region 143. The drain region 151 is an impurity doped region of the second conductivity type and may be doped with a higher concentration of impurities than the first well region 141. The heavily doped region 153 is also a doped region of the second conductivity type and may be doped with a higher concentration of impurities than the second well region 143.

The drain region 151 and the heavily doped region 153 are preferably formed on the surface of the substrate 101. The above-described heavily doped region 153 functions as a guard ring together with the second well region 143 to reduce leakage current and improve safe operating area (SOA) conditions. The drain region 151 may be electrically connected to a drain electrode (not shown), and the well region 141 surrounding the drain region 151 is a drain extension region and may improve breakdown voltage characteristics of a high voltage semiconductor device. In addition, the STI region 195 may be formed between the drain region 151 and the heavily doped region 153.

A body region 160 may be formed in the substrate 101. The body region 160 is a heavily doped region of the first conductivity type, and may be formed to be spaced apart from the deep well region 130 or may be formed to contact the deep well region 130 with each other. A source region 161 is formed in the body region 160 and on the surface side of the substrate 101. The source region 161 is a heavily doped region of a second conductivity type and may be electrically connected to a source electrode (not shown). In addition, a body contact region 163 may be formed in the body region 160 and on a side adjacent to or in contact with the source region 161. The body contact region 163 may be a heavily doped region of the first conductivity type.

A gate electrode 170 may be formed on the substrate 101. For example, the gate electrode 170 may be formed between the drain region 151 and the source region 161 within the active region. The gate electrode 170 is positioned on a channel region, enabling on and off control of the channel region through the gate voltage applied to the gate electrode 170. The gate electrode 170 may be made of, for example, conductive polysilicon, metal, conductive metal nitride, and combinations thereof, and may be formed by performing a CVD, PVD, ALD, MOALD, or MOCVD process, etc., but is not limited thereto.

A gate insulation film 171 is formed between the gate electrode 170 and the surface of the substrate 101, and the gate insulation film 171 may be formed of any one of a silicon oxide layer, a high-k layer, and a combination thereof. The gate insulation film 171 may be formed by performing an ALD, CVP, or PVD process.

A sidewall of the gate electrode 170 may be covered by a gate spacer 173, and the gate spacer 173 may be formed of any one of a nitride film, an oxide film, and a combination thereof.

In addition, on the substrate 101, an interlayer dielectric 180 is formed to completely cover the gate electrode 170. The interlayer dielectric 180 may be formed, for example, by using a borophosphosilicate glass (BPSG) film and a tetra ethyl ortho silicate (TEOS) film, but the scope of the present disclosure is not limited thereto.

Referring to FIGS. 4 and 5, the DTI region 190 may be formed from the surface (upper surface) of the substrate 101 to a predetermined depth. The DTI region 190 may include: the wide region 191 having relatively large left-right (lateral) width on the upper side thereof; and the narrow region 193 beneath the wide region 191. Accordingly, the wide region 191 may have a larger lateral width than the narrow region 193. In this case, the lower end of the wide region 191 may be configured to be connected to the upper end of the narrow region 193.

To be specific, it is desirable that the sidewall of the wide region 191 on the boundary side with the narrow region 193 is formed with the inclined surface 191a having a lateral width gradually narrowing as it extends downward so as to be naturally connected to the upper end of the narrow region 193. At this time, the cross-section of the sidewall of the inclined surface 191a may have a substantially straight or curved shape, or may include both straight and curved shapes, and the scope of the present disclosure is not limited by specific examples. In addition, the cross-sectional shape of the side wall of the wide region 191 excluding the inclined surface 191a may also be substantially straight or curved, or formed to include both straight and curved portions.

As such, the wide region 191 may be configured to have a side on which the lateral width gradually narrows as it extends downward from the surface of the substrate 101. Preferably, the wide region 191 has a maximum lateral width greater than the uppermost lateral width of the narrow region 193. In addition, it is preferable that the minimum width of the wide region 191 in the lateral direction is substantially the same as the width of the uppermost part of the narrow region 193 in the lateral direction.

As previously described, when the side cross-sectional shape of the inclined surface 191a of the wide region 191 is curved, it may have a bowing shape. That is, the boundary of the wide region 191 connected to the narrow region 193 is inclined so that the lateral width gradually narrows as it extends downward. As will be described later, the wide region 191 is preferably formed by an additional etching process after forming the narrow region 193. In addition, the narrow region 193 may extend with a constant lateral width so as to be substantially orthogonal to the surface of the substrate 101 as it extends downward, or may extend obliquely so as to become narrow as it goes downward, and there is no particular limitation thereto. The DTI region 190 including the wide region 191 and the narrow region 193 is preferably gap-filled with the same material as the interlayer dielectric 180, but the scope of the present disclosure is not limited thereto.

Hereinafter, the structure and problems of an isolation region 91 including a DTI region 91b in the conventional high voltage semiconductor device 9, and the high voltage semiconductor device 1 according to the embodiment of the present disclosure to solve these problems will be described with reference to the accompanying drawings.

Figure 1:
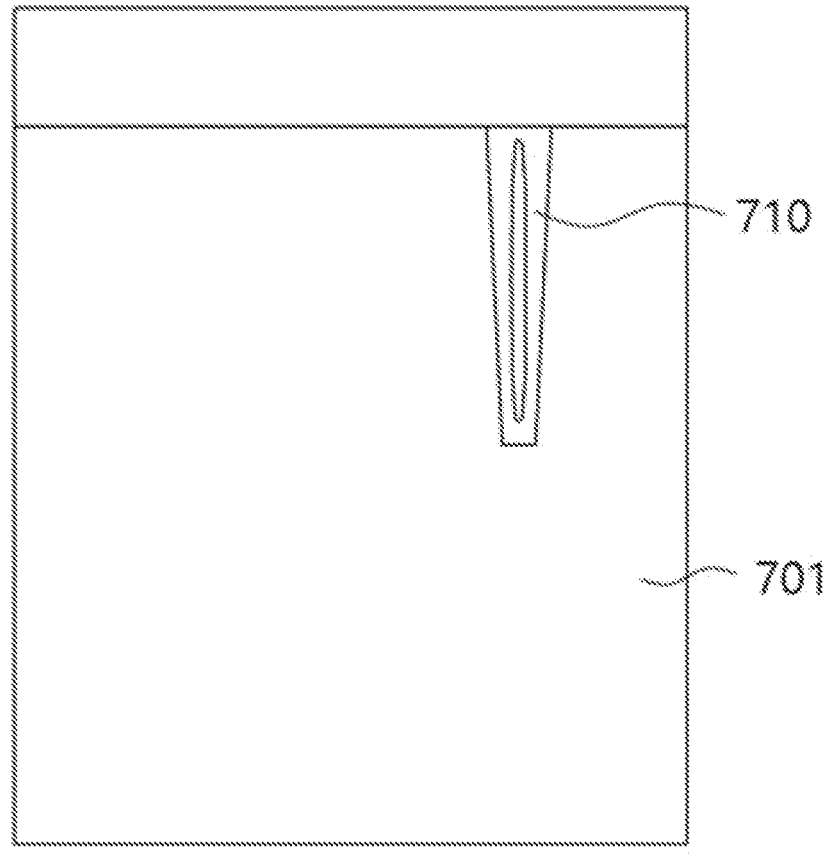
FIGS. 1 and 2 are cross-sectional views showing the structure of a conventional high voltage semiconductor device.
Figure 2:
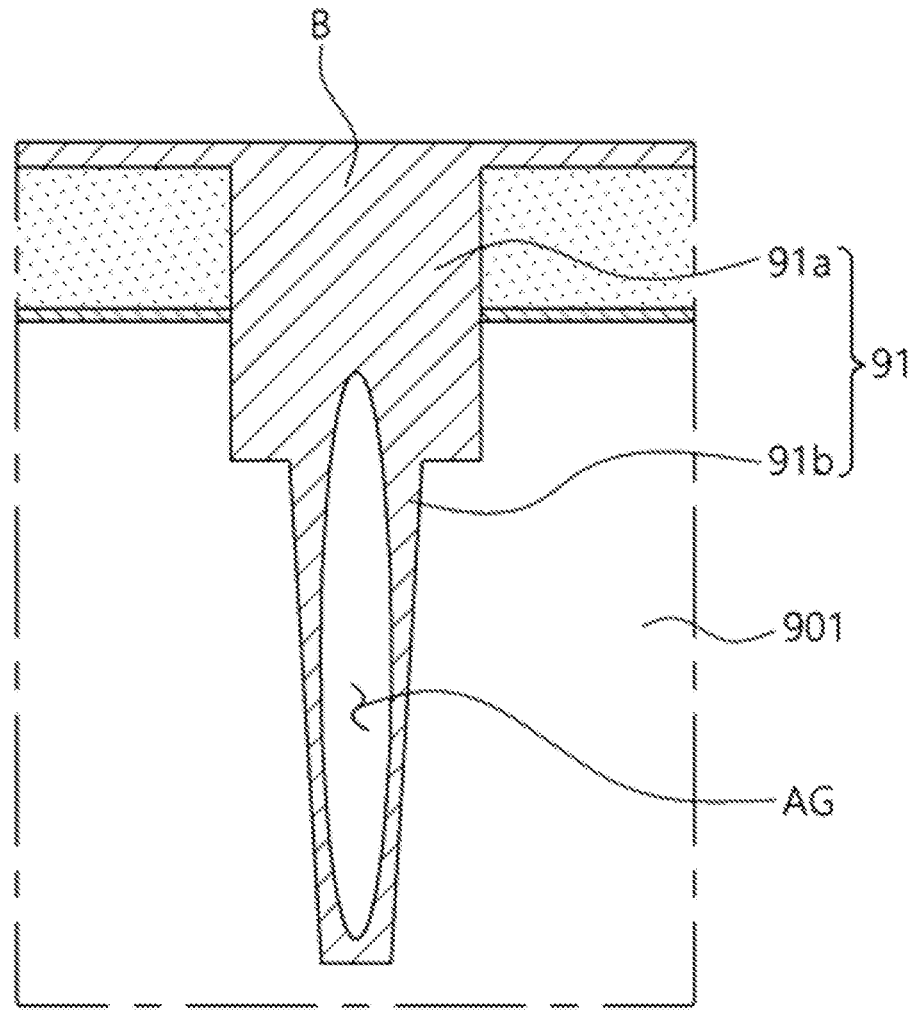

Referring to FIG. 2, in the high voltage semiconductor device 9 according to an embodiment, in order to form the isolation region 91 at a sufficiently deep position within a substrate 901, the isolation region 91 is formed to include a Pre-DTI region 91a and a DTI region 91b. That is, the isolation region 91 is formed in two stages.

When the DTI region 91b is formed after the Pre-DTI region 91a is formed as described above, since separate mask patterns PRa and PRb need to be used for each step, manufacturing cost may increase. Moreover, since a step is formed on the sidewall boundary between the Pre-DTI region 91a and the DTI region 91b, manufacturing defects may be caused.

When the isolation region 91 is formed in two stages, the Pre-DTI region 91a and the DTI region 91b, as described above, a separate mask pattern needs to be used for each trench formation step, manufacturing cost may increase.

Figure 3:
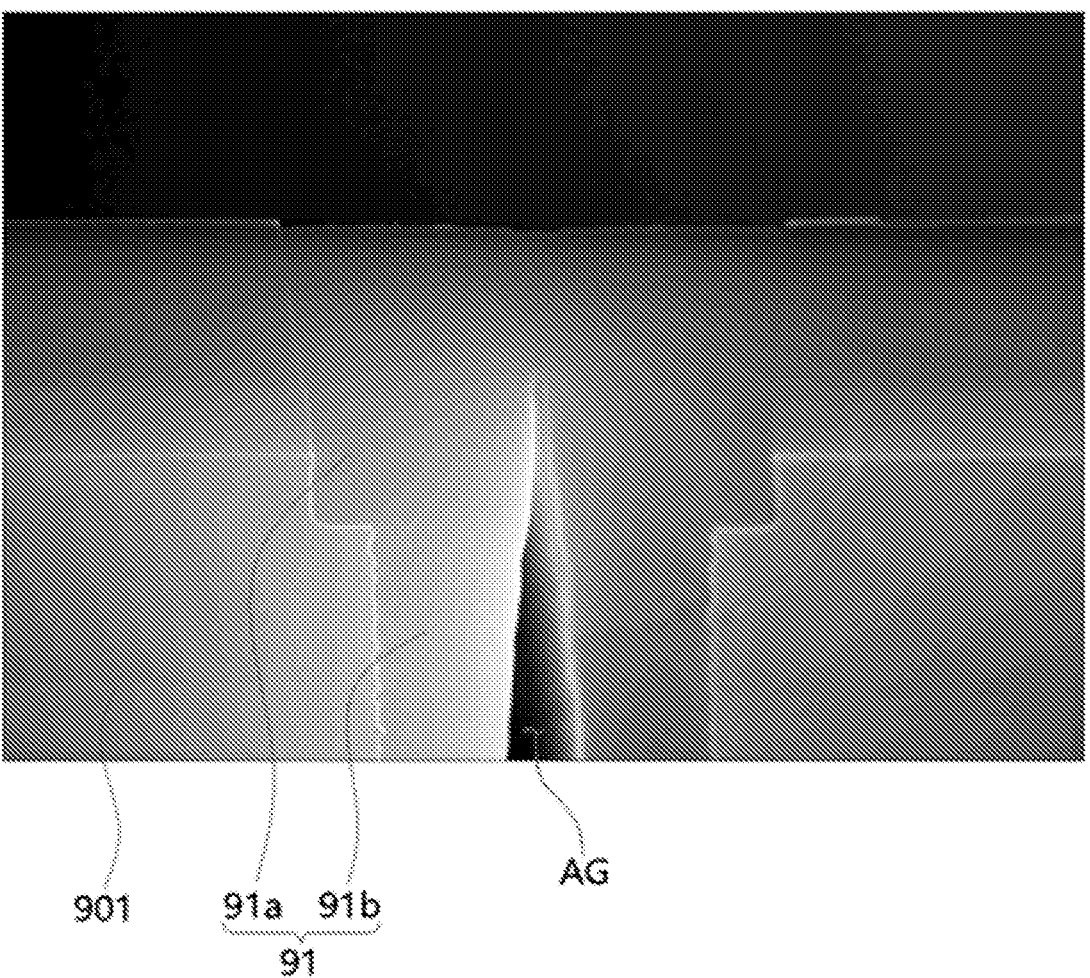
FIG. 3 is an SEM picture showing a formation position of an upper end of an air gap in the high voltage semiconductor device shown in FIG. 2.

In addition, when the upper end of an air gap AG formed in the isolation region 91 extends to the Pre-DTI region 91a on the substrate 901 (see FIGS. 2 and 3), that is, when the upper end of the air gap AG is formed at a relatively high position, the possibility of cracks occurring along the Pre-DTI region 91a of the upper part of the air gap AG cannot be ruled out in a subsequent process.

To solve the above problems, referring to FIGS. 4 and 5, the high voltage semiconductor device 1 according to the embodiment of the present disclosure provides the DTI region 190 composed of the wide region 191 and the narrow region 193. As previously mentioned, the wide region 191 is formed by an additional etching process after forming the narrow region 193, and due to the wide region 191, the upper end of the air gap A may be positioned relatively deep within the substrate 101. At this time, it is desirable that the sidewall of the wide region 191 has a curved, not straight, cross-sectional shape on the part where the lateral width of the wide region 191 is narrowed, so that a step is not formed at the boundary with the narrow region 193, but the scope of the present disclosure is not limited thereto. In addition, the wide region 191 has an advantage in that a separate mask pattern for forming the wide region 191 is not used, which will be described later.

As described in detail in the manufacturing method below, the DTI region 190 may be formed, for example, by forming a first trench T1 by etching the substrate 101 through a non-Bosch process before forming a second trench T2 under the first trench T1 by performing a Bosch process, and then forming an upper region T3 on the side where the wide region 191 is to be formed through a separate etching process, and then gap-filling the insulating material.

Referring to FIG. 4, the STI region 195 having a predetermined depth may be formed on the surface side of the substrate 101. The STI region 195 may overlap the DTI region 190. That is, it is preferable that one side of the DTI region 190 is formed to pass through the STI region 195, and it is more preferable that the STI region 195 is formed to surround the wide region 191. At this time, it is preferable that the upper end of the air gap A in the DTI region 190 is positioned deeper than the bottom of the STI region 195 in the substrate 101. For example, it is preferable that the upper end of the air gap A is spaced apart from the surface of the substrate 101 by 4000 A (angstrom). Accordingly, when the STI region 195 is formed after the DTI region 190 is formed, cracks may be prevented from occurring on the upper side of the air gap A as much as possible, but the scope of the present disclosure is not limited thereto.

FIGS. 6 to 12 are reference cross-sectional views showing a method of manufacturing the high voltage semiconductor device according to an embodiment of the present disclosure.

Hereinafter, a method of manufacturing the high voltage semiconductor device according to the embodiment of the present disclosure will be described in detail with reference to the accompanying drawings. The following method of manufacturing focuses on the DTI region 190.

Figure 6:
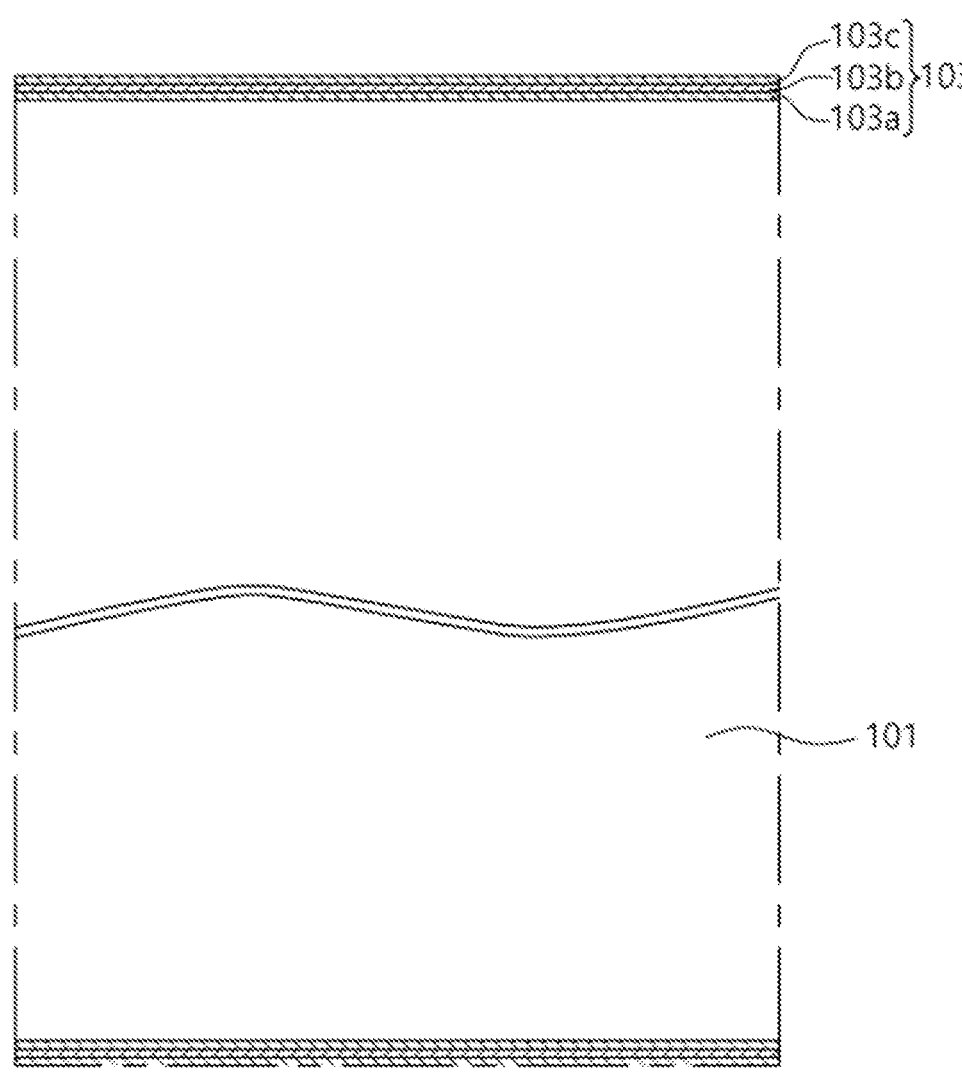
FIGS. 6 to 12 are reference cross-sectional views showing a method of manufacturing the high voltage semiconductor device according to an embodiment of the present disclosure.

Referring to FIG. 6, first, an ONO layer (or film) 103 may be formed on the substrate 101. The ONO layer 103 has a structure in which an oxide layer-nitride layer-oxide layer is stacked. For example, after depositing an oxide layer 103a on the substrate 101, a nitride layer 103b such as SiN is deposited. Then, the ONO layer 103 may be completed by depositing, for example, a TEOS layer 103c on the nitride layer 103b. The ONO layer 103 may function as an etch stop layer during an etching process for forming an upper region T3 to be described later.

Thereafter, the side of the substrate 101 where the DTI region 190 is to be formed is etched to a predetermined depth. For example, a trench having a predetermined depth may be formed by performing an etching process after forming a mask pattern PR1 having an open side on which the DTI region 190 is to be formed on the ONO layer 103. Prior to an illustrative description of the trench formation process, a general Bosch process will be described.

The DTI region 190 is formed to a depth of several tens of μm, for example, approximately 10 μm or more and 40 μm or less from the surface of the substrate 101. Thus, for deep Si etching, etching is performed through the Bosch process when the DTI region 190 is formed. This Bosch process is a cyclic process in which etching and deposition are alternately performed. Specifically, a protective film is deposited first, and in a subsequent step, the protective film on the bottom surface of the pattern and the silicon substrate are etched, and this process may be repeated to form a trench. At this time, due to the nature of the Bosch process, an uneven or continuous water drop-shaped scallop S (see FIG. 7) is formed on the inner wall of the trench T. Since such a scallop S exists from the upper end of the trench, the lateral width of the uppermost (or inlet) side of the trench is narrowed, which means that the upper end of the air gap A is positioned relatively high (or shallow depth) in a subsequent process. Therefore, the possibility of cracking increases.

Figure 7:
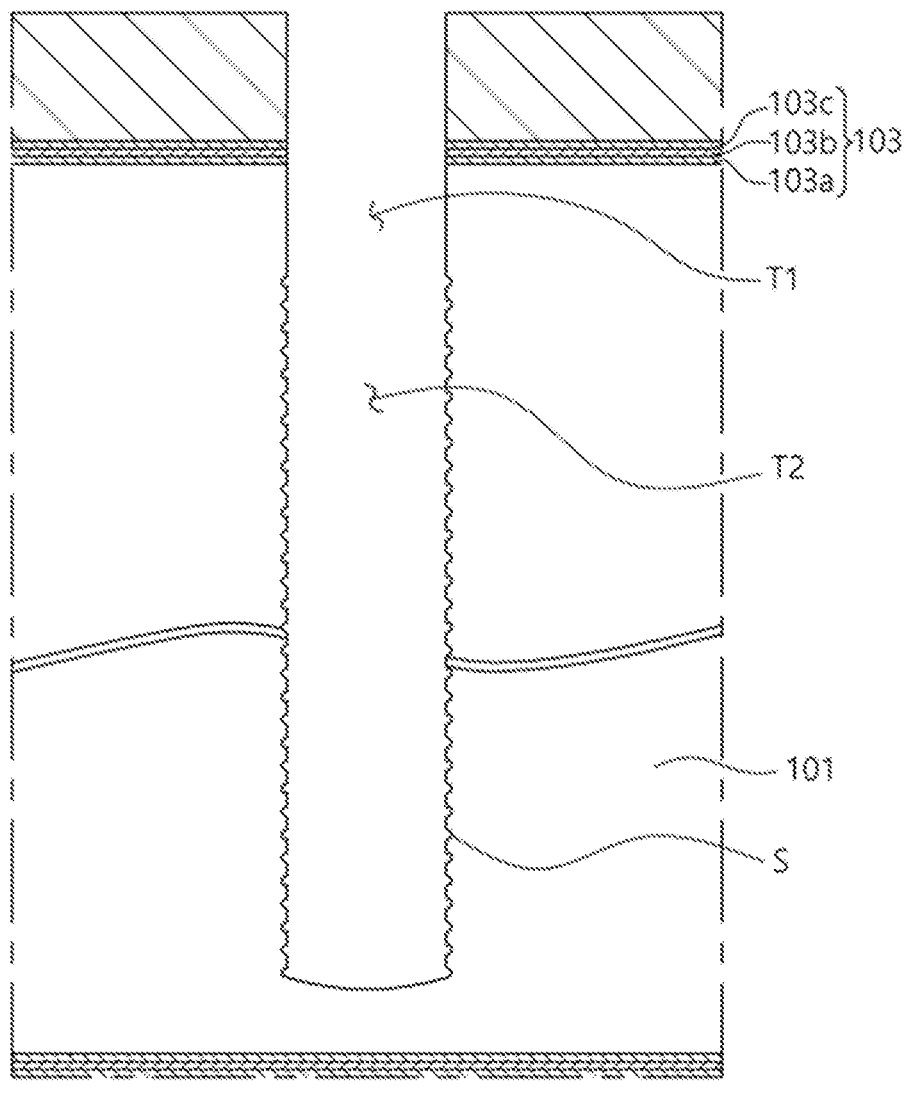

In order to solve such a problem, in the manufacturing method of the high voltage semiconductor device according to the embodiment of the present disclosure, when forming the trench, a first trench T1 is formed by performing, for example, a non-Bosch process, which is a first etching process, to a predetermined depth from the surface of the substrate 101, and then a second trench T2 is formed by performing, for example, a Bosch process, which is a second etching process, from the bottom of the first trench T1 to a predetermined depth of the substrate 101 (see FIG. 7). By forming the trench through two processes as described above, it is possible to prevent the width of the uppermost part of the trench from being narrowed in the lateral direction. Both the non-Bosch process and the Bosch process may be performed using the same mask pattern PR1. However, unlike the above example, both the first trench T1 and the second trench T2 may be formed by the same process, and in this case, it is not necessary to separate the first trench T1 and the second trench T2.

Figure 8:
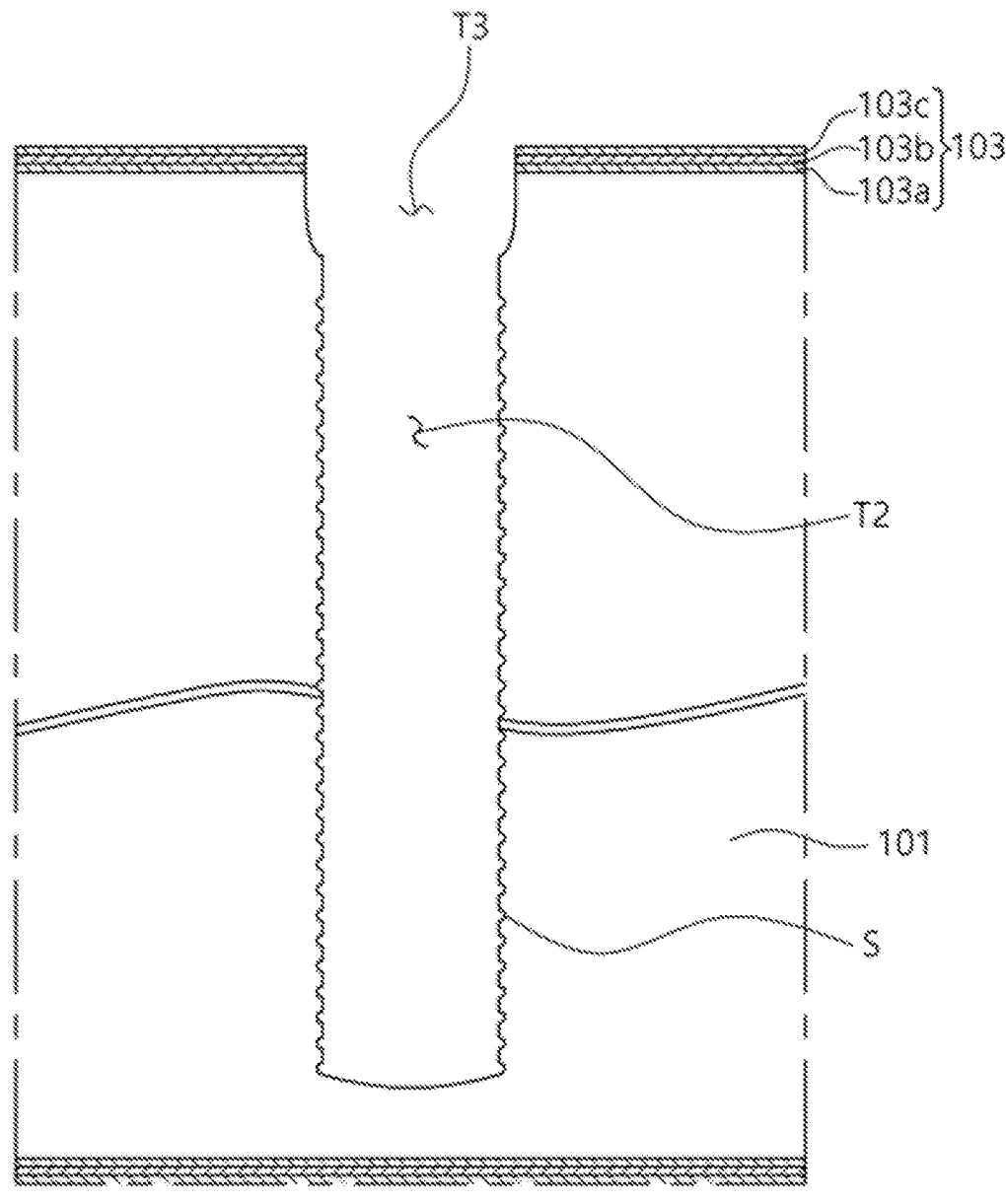

As a subsequent process, referring to FIG. 8, the upper region T3 is formed to increase the width of the uppermost part of the first trench T1 in the lateral direction. Since the ONO layer 103 functions as an etch stop layer, the upper region T3 may be formed without a separate mask pattern. The upper region T3 may be formed by performing an etching process by injecting a mixed gas of fluoroform (CHF3), tetrafluoromethane (CF4), and oxygen (O2) into a chamber where an internal space under a predetermined pressure condition (e.g., 30 mTorr or higher) is formed. CHF3 and CF4 may be utilized in a ratio of about 1.5 to 2.5:1. In addition, since the chamber satisfies the pressure condition of 30 mTorr or higher during the etching process, the process of forming the upper region T3 may be referred to as "high pressure treatment". At this time, sulfur hexafluoride (SF6) and/or argon (Ar) gas may be prevented from flowing into the chamber.

Figure 9:
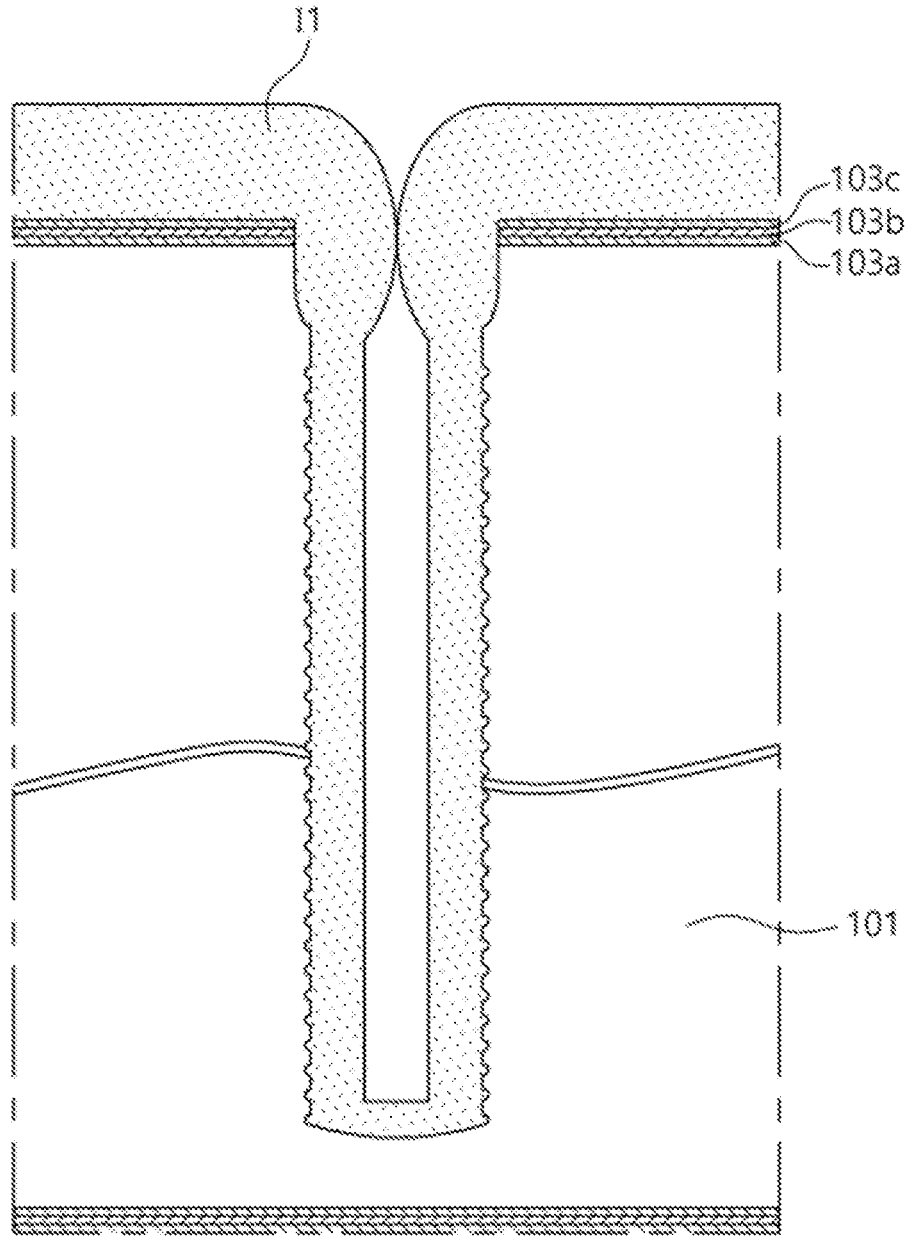

Thereafter, referring to FIG. 9, a first insulating layer I1 is deposited and gap-filled on the ONO layer 103 or the substrate 101 and in the trench T1+T2+T3. The first insulating layer I1 may be, for example, a SiO2 layer, but the scope of the present disclosure is not limited thereto. The first insulating layer I1 may be deposited along the inner walls of the first trench T1, the second trench T2, and the upper region T3.

Figure 10:
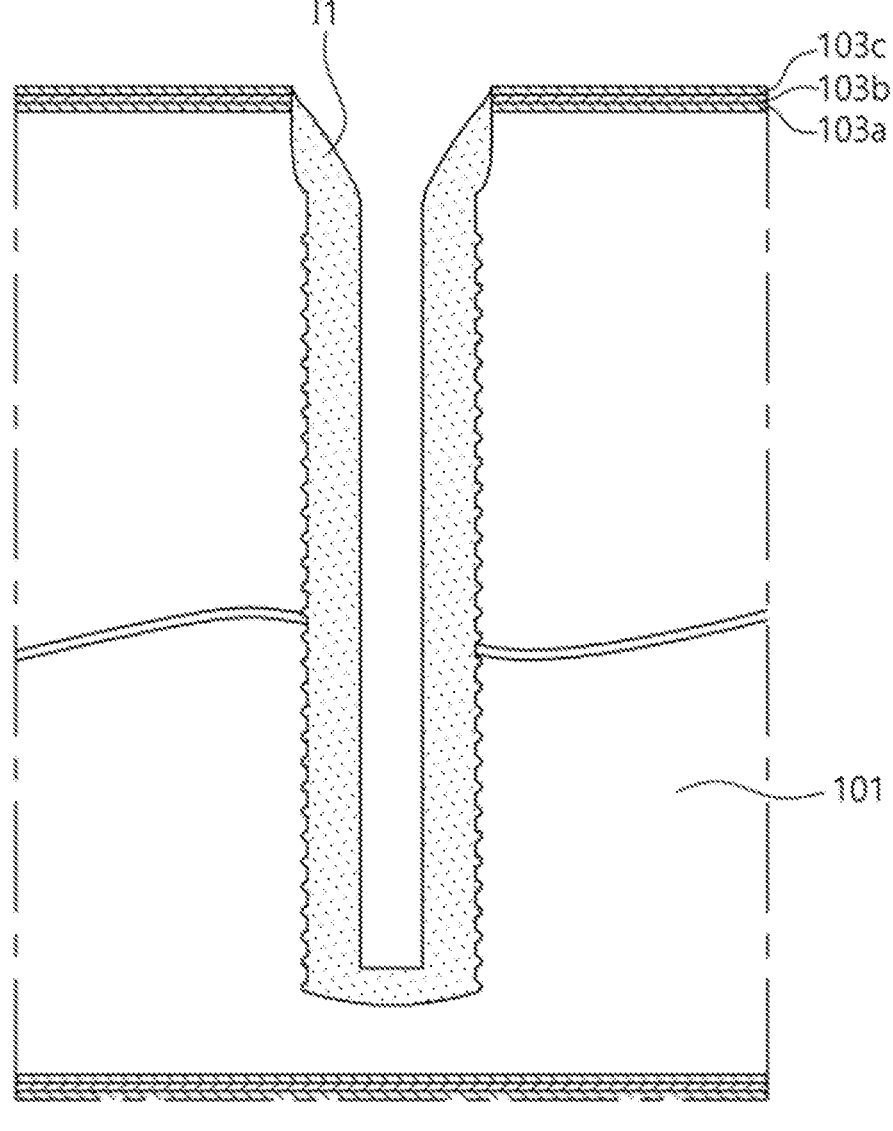

Thereafter, referring to FIG. 10, an etch back process is performed on the ONO layer 103 or the first insulating layer I1 remaining on the substrate 101. The etch back process is a process of etching at least a portion of the first insulating layer I1 deposited on the ONO layer 103 and filled in the trench.

Figure 11:
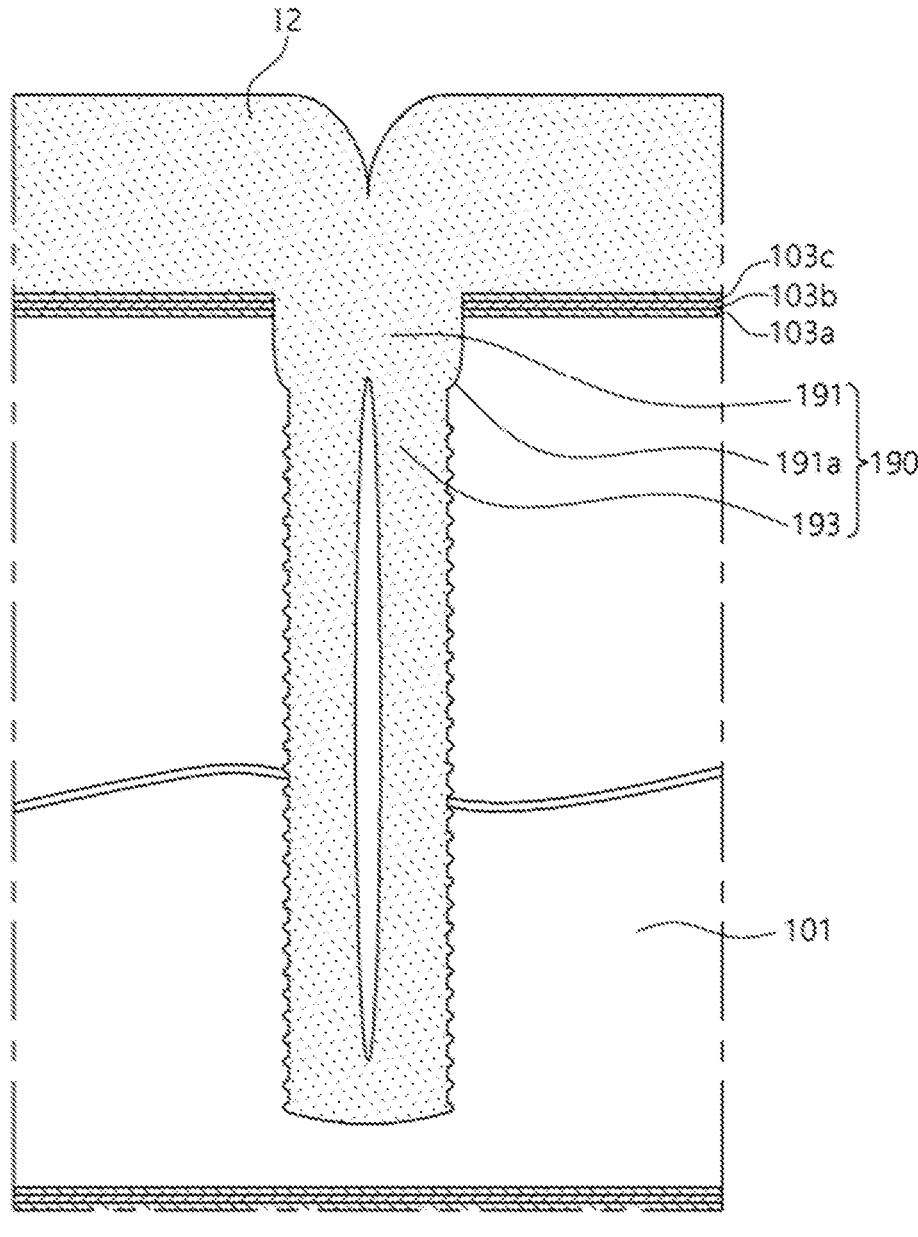

Thereafter, referring to FIG. 11, a second insulating layer I2 is deposited and gap-filled on the ONO layer 103 or the substrate 101 and on the first insulating layer I1 inside the trench. The second insulating layer I2 may include the same material as the first insulating layer I1, but the scope of the present disclosure is not limited thereto. Due to the deposition of the second insulating layer I2, the air gap A is formed in the trench, and at the same time, it is possible to prevent noise generation between adjacent devices so as to be electrically stable. In addition, in the DTI region 190, the wide region 191 is formed on the narrow region 193 so that the upper end of the air gap A is formed relatively deep. In order to avoid redundancy, a detailed description thereof will be omitted.

Figure 12:
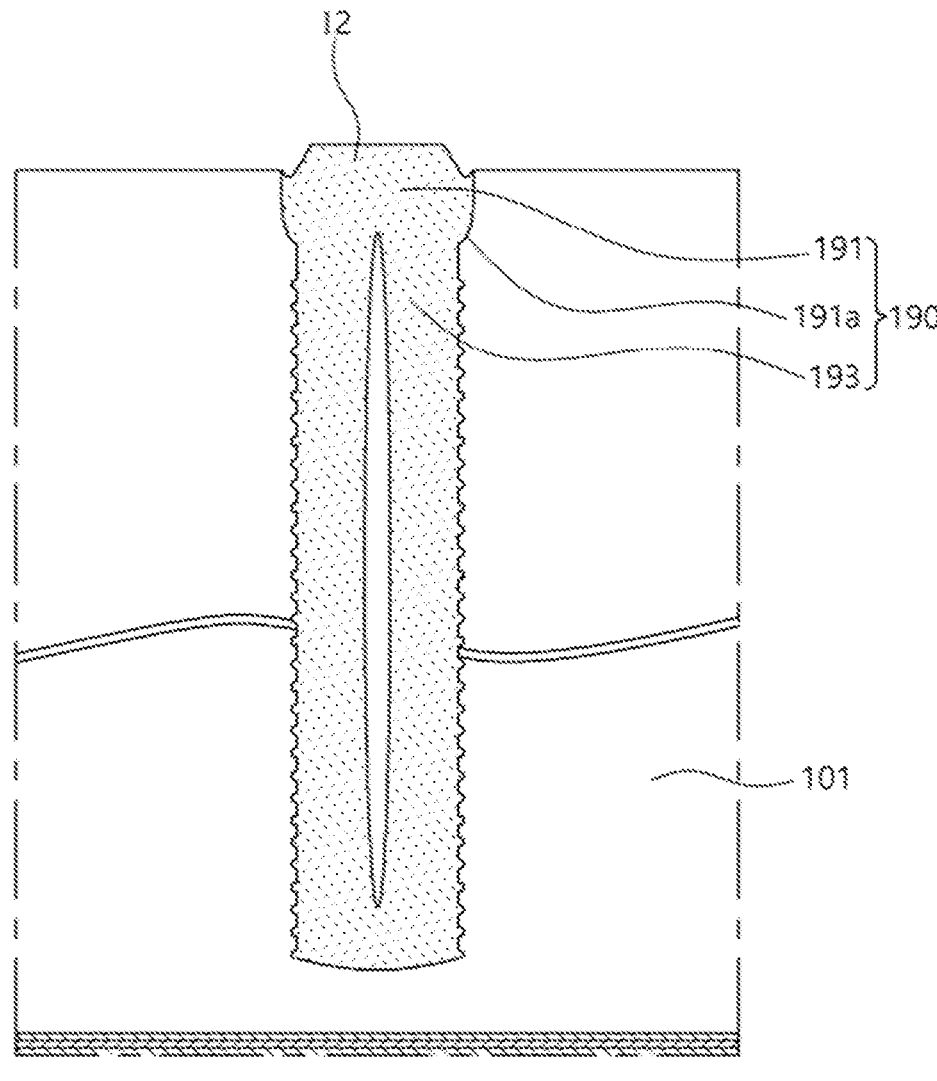

Thereafter, referring to FIG. 12, a process of removing the ONO layer 103 or the second insulating layer I2 on the substrate 101 is performed, which may be performed through a CMP process. Then, the ONO layer 103 on the substrate 101 is removed.

The above detailed description is illustrative of the present disclosure. In addition, the above description shows and describes preferred embodiments of the present disclosure, and the present disclosure can be used in various other combinations, modifications, and environments. In other words, changes or modifications are possible within the scope of the concept of the disclosure disclosed herein, the scope equivalent to the written disclosure, and/or within the scope of skill or knowledge in the art. The above-described embodiment describes the best state for implementing the technical idea of the present disclosure, and various changes required in the specific application field and use of the present disclosure are possible. Accordingly, the detailed description of the present disclosure is not intended to limit the present disclosure to the disclosed embodiments.

What is claimed is:

1. A high voltage semiconductor device, comprising:
a substrate;
a gate electrode disposed on the substrate;
a source region disposed on a surface of the substrate and a drain region spaced apart from the source region;
a DTI region extending to a predetermined depth from the surface of the substrate and including an insulating material; and
an STI region surrounding one side of the DTI region in the substrate,
wherein the DTI region comprises:
a wide region positioned at an upper side of the DTI region;
a narrow region extending from a bottom of the wide region to a predetermined depth of the substrate and having a lateral width less than a lateral width of the wide region; and
an air gap disposed in the DTI region,
wherein the wide region includes an inclined surface at a sidewall of a lower portion thereof connecting to an upper portion of the narrow region, such that a lateral width of the DTI region at the inclined surface gradually narrows in a downward direction,
wherein the lateral width of the DTI region at the inclined surface narrows more sharply in the downward direction than both a lateral width of the DTI region at a remaining part of the wide region and the lateral width of the DTI region at the narrow region, and
wherein an upper end of the air gap is positioned deeper than a bottom of the STI region.

2. The high voltage semiconductor device of claim 1, wherein the inclined surface has a cross-sectional shape of a curved sidewall.

3. The high voltage semiconductor device of claim 1, wherein the wide region is formed by etching an upper region of a trench after forming the trench for the narrow region.

4. The high voltage semiconductor device of claim 1, wherein a lateral width of the bottom of the wide region is substantially equal to a lateral width of an uppermost part of the narrow region.

5. The high voltage semiconductor device of claim 1, wherein the narrow region has a scallop structure on at least one side wall thereof.

6. The high voltage semiconductor device of claim 1, wherein a maximum lateral width of the wide region is greater than a maximum lateral width of the narrow region.

7. The high voltage semiconductor device of claim 6, wherein the wide region has a substantially same lateral width as a lateral width of the narrow region at a boundary with the narrow region.

8. The high voltage semiconductor device of claim 6, further comprising:

a body region surrounding the source region in the substrate;

a deep well region surrounding a first well region in the substrate;

the first well region surrounding the drain region in the deep well region;

a buried layer disposed beneath the deep well region in the substrate; and a high-voltage well region connected to both the buried layer and the deep well region in the substrate.

9. The high voltage semiconductor device of claim 1, wherein the narrow region has a constant width as it extends in the downward direction.

10. The high voltage semiconductor device of claim 1, wherein the inclined surface has a cross-sectional shape of a straight sidewall as it extends in the downward direction.

11. The high voltage semiconductor device of claim 1, wherein the inclined surface has a cross-sectional shape including both a curved portion and a straight portion.

12. The high voltage semiconductor device of claim 1, wherein a bottom of the inclined surface is positioned deeper than the bottom of the STI region.

* * * * *